(12) United States Patent
Joisten et al.

(10) Patent No.: US 8,085,039 B2
(45) Date of Patent: Dec. 27, 2011

(54) MINIATURE MAGNETIC CORE, SENSOR COMPRISING SAME AND METHOD FOR MANUFACTURING SAME

(75) Inventors: Hélène Joisten, Grenoble (FR); Robert Cuchet, Monestier de Percy (FR); Bernard Viala, Sassenage (FR); Marcel Audoin, Noyarey (FR); Rachid Hida, Grenoble (FR)

(73) Assignee: Commissariat a l'Energie Atomique, Paris (FR)

( * ) Notice: Subject to any disclaimer, the term of this patent is extended or adjusted under 35 U.S.C. 154(b) by 504 days.

(21) Appl. No.: 12/097,487

(22) PCT Filed: Dec. 11, 2006

(86) PCT No.: PCT/FR2006/002699
§ 371 (c)(1), (2), (4) Date: Jun. 13, 2008

(87) PCT Pub. No.: WO2007/068816
PCT Pub. Date: Jun. 21, 2007

(65) Prior Publication Data
US 2008/0316647 A1     Dec. 25, 2008

(30) Foreign Application Priority Data
Dec. 14, 2005   (FR) ..................... 05 12674

(51) Int. Cl.
*G01R 33/04* (2006.01)
(52) U.S. Cl. .................................. 324/257
(58) Field of Classification Search .......... None
See application file for complete search history.

(56) References Cited

U.S. PATENT DOCUMENTS 2,984,825 A * 5/1961 Fuller et al. .............. 365/173
5,739,991 A * 4/1998 Matono et al. ............ 360/317

FOREIGN PATENT DOCUMENTS

| FR | 2 817 622 | 6/2002 |
| FR | 2 848 672 | 6/2004 |
| JP | 43-45378 | 10/1971 |
| JP | 09-197963 | 2/1999 |
| JP | 2004340953 A * | 12/2004 |
| WO | WO 2007/068816 A3 | 6/2007 |

OTHER PUBLICATIONS

International Search Report, May 30, 2007.
PCT Request in French, Dec. 4, 2006.
PCT Written Opinion in French, May 30, 2007.
Schoenstein, et al., "Influence of the domain structure on the microwave permeability of soft magnetic films and multilayers", Journal of Magetism and Magnetic Materials 292 (2005) 201-209.
Translation of Notice of Rejection (Official Action) dated Apr. 19, 2011 regarding Japanese Patent Application No. 2008-545038, pp. 5-13.

* cited by examiner

*Primary Examiner* — Vinh Nguyen
(74) *Attorney, Agent, or Firm* — Brinks Hofer Gilson & Lione

(57) ABSTRACT

A miniature magnetic core includes at least one bar magnet having, in the demagnetized state, a plurality of magnetic domains separated by magnetic walls, the bar magnet having permanent discontinuities placed at least approximately at the probable locations of at least some of these magnetic walls in the absence of these permanent discontinuities. A miniature sensor includes a miniature core that cooperates with at least one excitation coil and at least one detection coil. A method for manufacturing the magnetic core includes identifying the probable location of the magnetic walls, depositing at least a thin film of magnetic material on a support in order to form the core and producing, in said core, discontinuities approximately at the identified locations of the walls.

31 Claims, 3 Drawing Sheets

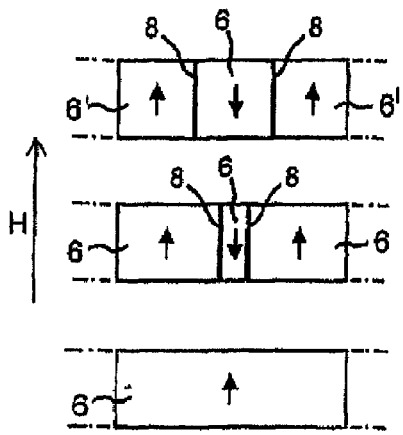
PRIOR ART Fig. 4
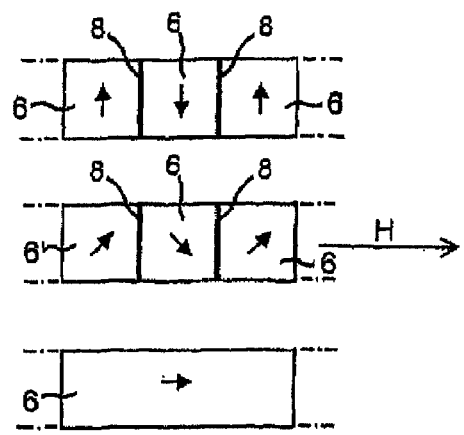
PRIOR ART Fig. 5
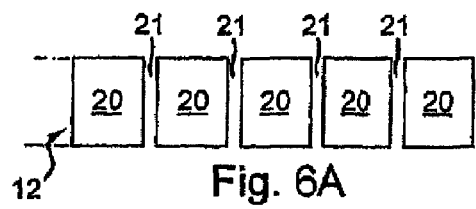
Fig. 6A
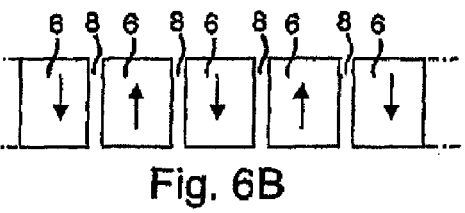
Fig. 6B
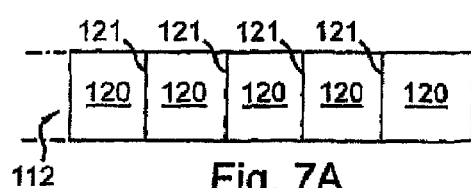
Fig. 7A
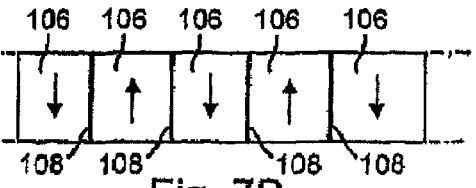
Fig. 7B
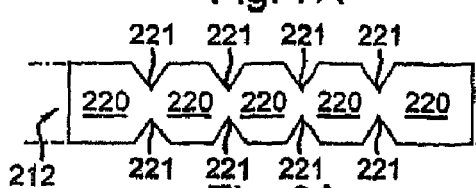
Fig. 8A
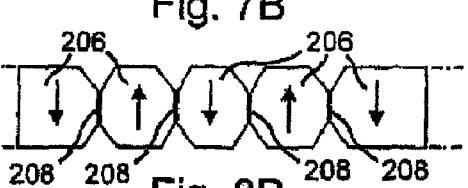
Fig. 8B
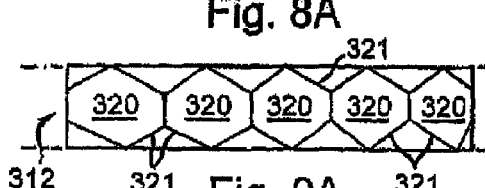
Fig. 9A
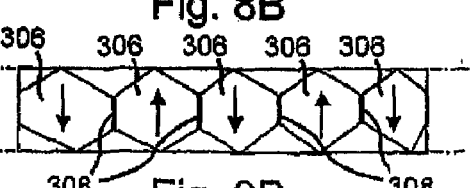
Fig. 9B
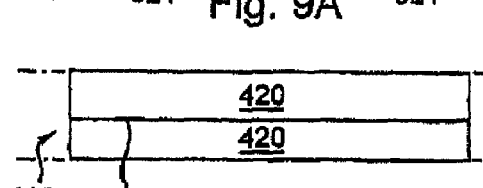
Fig. 10A
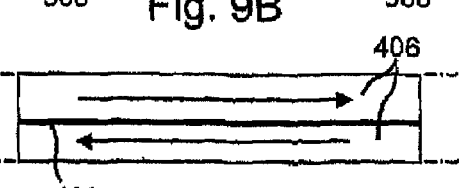
Fig. 10B

MINIATURE MAGNETIC CORE, SENSOR COMPRISING SAME AND METHOD FOR MANUFACTURING SAME

PRIORITY CLAIM

This application is a U.S. nationalization of PCT Application No. PCT/FR2006/002699, filed Dec. 11, 2006, and claims priority to French Patent Application No. 0512674, filed Dec. 14, 2005.

TECHNICAL FIELD

The invention relates to the structure and manufacture of a miniature magnetic core and of a miniature magnetic sensor designed on the basis of this magnetic core.

BACKGROUND

Miniature magnetic cores are used to manufacture in particular miniature magnetic field sensors also called "microflux gate sensors".

These miniature sensors are designed to measure magnetic fields (or variations of magnetic fields) that are particularly continuous or of low frequency, and of the order of a few nanoTeslas currently. They are particularly used to detect the very slight variations of the Earth's magnetic field.

SUMMARY

FIG. 1 is a schematic diagram of such a sensor having a closed miniature magnetic core comprising two branches 3 around which are wound excitation coils 4 and a detection coil 5.

The excitation circuits periodically lead the magnetic core to saturation while the detection coil situated around this magnetic core measures the changes of magnetic flux within the magnetic core through the induced voltage. Because of the nonlinear behavior of the B-H curve of the magnetic materials, the magnetic flux collected by the detection coil does not have the same alternations in the presence or absence of the magnetic field to be measured. The presence of the magnetic field to be measured can therefore be detected in the even-order harmonics ($2f$, $4f$, etc.) of the detection signal (in particular the harmonic of order 2).

To enhance the sensitivity of the sensor, the windings of the detection coil 5 are mounted in differential in order to double the amplitude of the even harmonics of the measured signal.

The small size of these sensors provides great lightness, small footprint and a low manufacturing cost because of the use of collective manufacturing techniques via the technology of magnetic microelectronics.

However, the effect of the miniaturization causes various instabilities, sources of noise, in practice preventing detecting weaker magnetic fields, of the order of the picoTesla. Such fields are detectable by sensors of larger dimensions because they do not have the instabilities specific to the miniature sensors.

The measurement signal, temporal or frequential, is therefore very degraded in practice and has a noise that can reach amplitudes of 100 to 1000 nanoTeslas much greater than the amplitude that would be presented by the noise of such a signal in the absence of these instabilities (a few nanoTeslas).

These instabilities, also called "offset jumps", are reproduced in a nonreproducible and unpredictable manner according to periods going from a few seconds to a few hours, or at low frequency.

This noisy behavior originates from the magnetic core and its origin is explained below with the aid of FIGS. 3 to 5.

In a material with ferromagnetic properties, several magnetic microstructures or magnetic domains (called Weiss domains) are observed in which the magnetic moments (represented by the various arrows in FIG. 3) are all oriented in the same direction.

It is possible to observe in FIG. 3 that these magnetic domains may be modeled according to two types of magnetic domains. There are therefore:

the main domains 6A, 6B within which the magnetization is oriented in the direction of easy magnetization of the magnetic material in one direction (domains 6A) or the other (domains 6B); and domains called "closing" domains 7A, 7B which provide the loop of the flux inside the magnetic material, the flux radiated to the outside of the magnetic material then being practically zero.

The magnetic material therefore consists of a plurality of magnetic domains (together forming magnetic loops) separated from one another by magnetic walls (for example "Bloch walls").

In practice, the dimensions of these domains fluctuate mainly from one material to the other, and also depend on the dimensions (length, width and thickness), the structure (single or multilayer) and the anisotropy of the magnetic material.

The division into magnetic domains may be observed particularly by "micro Kerr effect" by sending a polarized electromagnetic wave on the magnetic material and then observing the various changes of polarization of the reflected wave depending on the domain on which the reflection has taken place.

When the magnetic material is excited by an excitation field H directed along a first favored axis of the magnetic material (called the easy magnetization axis or else easy axis), as illustrated in FIG. 4, the magnetic domains for which the orientation of the excitation is the most favorable are favored and develop to the detriment of those whose orientation is opposite. The magnetic walls separating the various main magnetic domains (the closing domains are of small dimension and not shown) then move in order finally to allow the appearance of only a single magnetic domain whose magnetic moment has the same orientation as the excitation field H.

If the excitation field H is applied along a second favored axis of the magnetic material (also called the difficult axis), perpendicular to the easy axis, as illustrated in FIG. 5, the user witnesses not a movement of the magnetic walls but a progressive rotation of the magnetic moments of the various magnetic domains until all the magnetic moments have one and the same orientation corresponding to that of the excitation field H.

When there are movements and jumps of magnetic walls (that is to say when the component of the excitation field H along the easy axis is not zero), these phenomena give rise to irreversible losses by hysteresis in the magnetic materials (also called Barkhausen noise) and may therefore produce the instabilities of the micro-flux gates. During their movement, the magnetic walls will have to overcome some potential barriers caused by the defects of the crystal (impurities, stresses, dislocations, grain joints). The movement of the walls is therefore jerky, irreversible and dispersive and takes place by jumps by moving from one defect in the material to another forming as many anchor points for the magnetic walls. It is this movement of the magnetic walls that is at the origin of the Barkhausen noise.

It is therefore easy to understand the origin of the phenomenon of losses by hysteresis and of the instabilities that arise therefrom.

Such instabilities appear only when the size of the magnetic domains is not negligible faced with the dimension of the magnetic cores, which is the case of the miniature cores used to produce miniature magnetic field sensors.

Specifically, for cores of greater size, these instabilities do not exist. The "macro-flux gate" sensors may consequently measure magnetic fields that are a thousand times weaker, of the order of the picoTesla, the noise of the magnetic domains being averaged and therefore not being involved in the output signal.

In order to limit these instabilities, the "micro-flux gate" sensors are designed to as to favor only the phenomena of rotation of magnetization of the magnetic core by applying the excitation field H on the difficult axis and with coupled magnetic multilayers which minimize these instabilities.

However, a magnetic noise still subsists. Specifically, with each alternation of the excitation field H, the magnetic walls of the magnetic material reappear in the demagnetized state so that with each alternation of the magnetic flux, even if the latter travels only by rotation of magnetization, the magnetic walls disappear and reappear alternately and may therefore very well reappear in a slightly different location from the previous one. This phenomenon of movement of the magnetic domains from one alternation to the other may therefore be assimilated in equivalent manner to a movement of a magnetic wall as in the case in which the field is applied along the easy axis.

In addition, this phenomenon is amplified in the particular case of the micro-flux gate since the magnetic core of such an apparatus has strong variations of its magnetic domain configuration because it must of necessity have magnetic domains which are saturated alternately positively and negatively at the frequency of the excitation field. The portions of the magnetic core therefore pass alternately from a positive saturated state to a negative saturated state while, on each alternation, passing through a balanced state in which the magnetic walls reappear to delimit magnetic domains and are then capable of generating, as has been seen above, a random interference magnetic noise associated with the nonreproducibility of their positioning.

Already known particularly through French patent No. 2 851 661 are miniature magnetic field sensors for which the shape of the magnetic core has been designed for the purpose of reducing the magnetic noise.

Also known through French patent No. 2 817 622 are miniature magnetic field sensors in which the magnetic core is arbitrarily chopped to limit the movement of the magnetic walls to the dimension of the chopped portions.

SUMMARY

The subject of the invention is a miniature sensor of the same type but designed to further minimize this magnetic noise.

For this purpose, an aspect of the invention proposes a miniature magnetic core comprising at least one magnetic bar having, in the demagnetized state, a plurality of magnetic domains separated by magnetic walls, characterized in that said bar has permanent discontinuities placed at least approximately in the probable locations of at least some of these magnetic walls in the absence of these permanent discontinuities.

The discontinuities, for example geometric or structural, produced in the core therefore form, in the demagnetized state, as many macroscopic and reproducible anchoring zones of the magnetic walls to prevent the latter from occupying uncontrollable and random microscopic anchoring zones that are formed by the natural defects of the material. With each alternation of the flux, during the return to the demagnetized state, the magnetic walls, when they reappear, move naturally and systematically at the discontinuities of the magnetic core.

The arrangement of the discontinuities according to the probable location of the magnetic walls ensures a maximum chance of seeing the magnetic walls being fixed at the discontinuities thus formed since it is substantially at these locations that they would appear in the absence of these discontinuities.

The arrangement of these discontinuities therefore minimizes the random movement of the magnetic walls from one alternation of the flux to the other and therefore also the noise which is the consequence thereof. The reduction of this noise makes it possible to significantly increase the resolution of the sensors using such cores and to detect much weaker magnetic fields.

According to the preferred features, for reasons of simplicity, convenience and economy of application, if necessary combined:

at least some of said discontinuities are total restrictions of section of said bar; and where necessary said restrictions form air gaps; or at least some of said discontinuities are partial restrictions of section of said bar; and where necessary said partial restrictions are local restrictions of thickness of said bar; and where necessary said restrictions extend in the transverse direction of said bar; or said restrictions extend in the longitudinal direction of said bar; and/or said restrictions form grooves made in said bar; and/or said restrictions are local restrictions of the width of said bar; or said restrictions are local restrictions of the length of said bar; and/or said restrictions each form at least one notch on the edge of said bar; or said restrictions each form two notches opposite one another and on either side of said bar; or at least some of said discontinuities are inhomogeneities of structure of said bar; and where necessary said inhomogeneities are on the surface of said bar; or said inhomogeneities are in the volume of said bar; and/or said inhomogeneities are inclusions of material; and/or said core comprises a second bar similar to said first bar; and where necessary said bars are connected to one another at their ends by sections made of magnetic material and form a closed magnetic circuit; and/or said core is formed of a stack of successive layers; and where necessary at least some successive layers are magnetically coupled.

The invention also relates, under a second aspect, covering an application of the aforementioned core, to a miniature magnetic field sensor, characterized in that it comprises said miniature core interacting with at least one excitation coil and one detection coil.

The invention also relates, under a third aspect, to a method for manufacturing said magnetic core, characterized in that it comprises:

the step of identifying the probable location of the magnetic walls separating the magnetic domains of said magnetic core to be manufactured;

the step of depositing at least one thin layer of magnetic material on a base to form said magnetic core; and the step of producing in said core discontinuities substantially in the identified locations of said magnetic walls.

According to preferred features, for reasons of simplicity and convenience both for manufacture and use, if necessary, combined:

the identification step comprises the step consisting in predicting at least approximately, according to the features of said magnetic core to be manufactured, the position of said locations; or the identification step comprises a step consisting in observing by micro Kerr effect said locations within a magnetic core deprived of discontinuities and of same features as said magnetic core to be manufactured; and/or said step for producing at least some of the discontinuities is applied by formation of restrictions on said thin layer; or said step for producing at least some of said discontinuities is applied by formation of inhomogeneities in said thin layer.

BRIEF DESCRIPTION OF THE DRAWING

The explanation of the invention will now be followed by the description of an exemplary embodiment, given below as an illustration but nonlimiting, in support of the appended drawings. In these drawings:

FIGS. 4 and 5 are two diagrams illustrating respectively how the magnetic moments evolve within the magnetic material when the excitation magnetic field is applied along the easy axis of the material and when this magnetic field is applied along the difficult axis;

FIGS. 6A and 6B are two top schematic views illustrating the discontinuities, the magnetic walls and the magnetic domains of a section of one of the bars making up a first embodiment of the core according to the invention;

FIGS. 7A and 7B are two views similar to FIGS. 6A and 6B but for a second embodiment of the core according to the invention;

FIGS. 8A and 8B are two views similar to FIGS. 6A and 6B but for a third embodiment of the core according to the invention;

FIGS. 9A and 9B are two views similar to FIGS. 6A and 6B but for a fourth embodiment of the core according to the invention;

FIGS. 10A and 10B are two views similar to FIGS. 6A and 6B but for a fifth embodiment of the core according to the invention.

DETAILED DESCRIPTION

Figure 1:
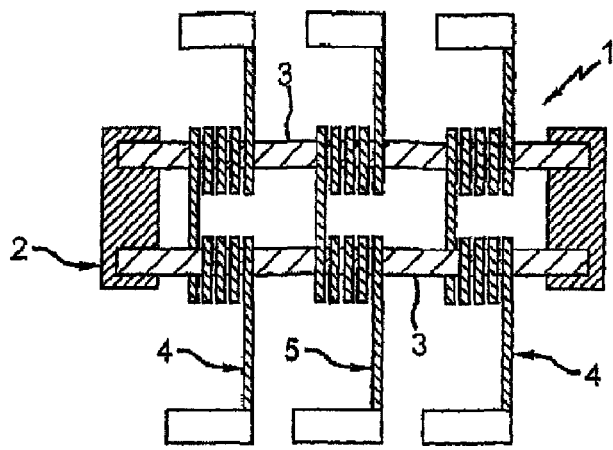
FIG. 1 is a diagram of a magnetic field sensor produced according to the techniques of the prior art.
Figure 2:
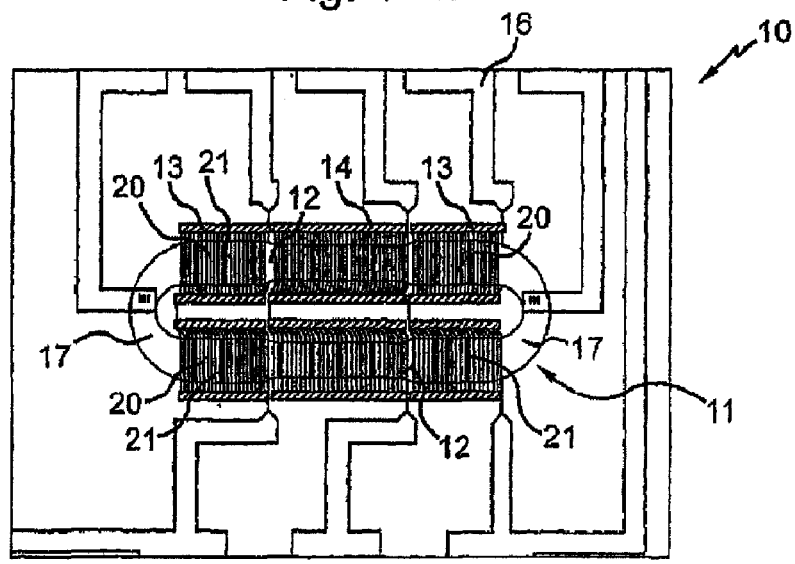
FIG. 2 is a diagram of a magnetic field sensor comprising a magnetic core according to the invention.
Figure 3:
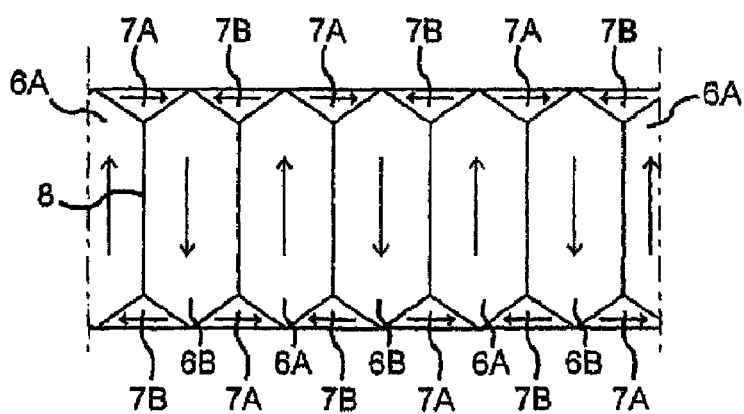
FIG. 3 is a diagram illustrating an example of the distribution of the main magnetic domains and the closing domains within a magnetic material.

The sensor 10 shown in FIG. 2 comprises a closed magnetic core 11 interacting with excitation coils 13 and a detection coil 14; this sensor comprises tracks 16 in contact with some of the turns of the coils thereby delimiting the coils 13 and 14.

The magnetic core is made of soft magnetic material deposited in a thin layer (notably: permalloy, amorphous or other material) and comprises two identical parallel bars 12 connected to one another at their ends by two semicircular sections 17.

In the example illustrated, the magnetic core 11 has a length of 1.4 mm and a width of 0.4 mm while each bar 12 has a length of 1 mm and a width of 0.1 mm (100 microns).

Each magnetic bar 12 (whereof a section is represented in FIGS. 6A and 6B) consists of a plurality of disjointed magnetic portions 20 separated from one another by air gaps 21. The dimensions of the magnetic portions 20 have been determined in advance by identifying the location of the magnetic domains 6, either by forecasting the natural size of the magnetic domains as a function of the nature, dimensions and structure of the bars 12, or by viewing these magnetic domains for example by micro Kerr effect. The magnetic portions 20 therefore have dimensions that are equal to or very slightly less than that of the magnetic domains 6 of the bars 12 so that the magnetic portions 20 are single-domain (they have only a single magnetic domain 6, thereby preventing any movement of the magnetic walls 8 with each alternation of the flux within the bars 12).

In the demagnetized state, as illustrated in FIG. 6B, the magnetic moments of two adjacent magnetic portions 20 are in opposite directions (the closing domains are of small dimension and not shown in the figures) and the magnetic walls 8 coincide with the air gaps 21. After the next alternation of the flux, the directions of the magnetic moments within the magnetic portions 20 are inverted relative to those represented in FIG. 6B but the magnetic walls 8 still coincide with the air gaps 21.

The positioning of the magnetic walls is therefore controlled and reproducible for each alternation of the magnetic flux.

The process of manufacturing a sensor according to the invention will now be described with the aid of FIGS. 11 to 15.

This involves steps that are hardly modified relative to those that may be used for certain magnetic sensors already produced in microtechnology but with magnetic cores having conventional bars.

Figure 11:
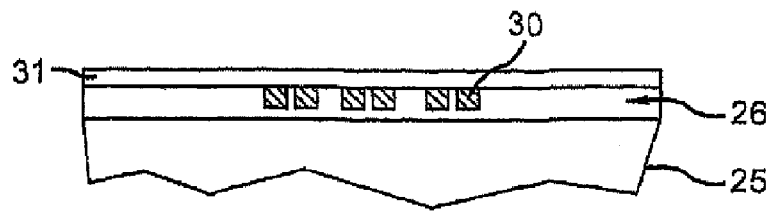
FIGS. 11 to 15 are diagrams representing five successive steps for manufacturing a sensor according to the invention.
Figure 12:
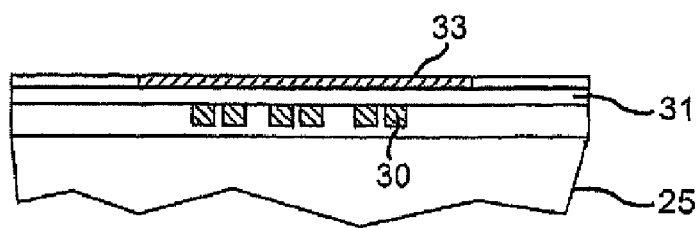

According to FIG. 11, the user begins with a substrate 25, for example made of silicon (but it may as a variant be notably of glass, quartz or ceramic) on which a layer 26 made of electrically insulating material (for example $SiO_2$) will be made forming a "coil case". Then, by electrolysis or by cathode sputtering, tracks 30 are made of a conductive material such as copper, aluminum, gold, tungsten, Ta/Au (a layer of tantalum overlaid with a layer of gold) and then this material is planarized. Finally a layer of insulation 31 is deposited (typically $SiO_2$ with a thickness of 4 microns in the example illustrated), before a planarization treatment is applied thereto (leaving up to less than 1 micron of insulation 31 on the conductive material).

Then (FIG. 12) a deposit of magnetic material 33, for example FeNi, is made to a thickness of the order of 1 micron.

Figure 13:
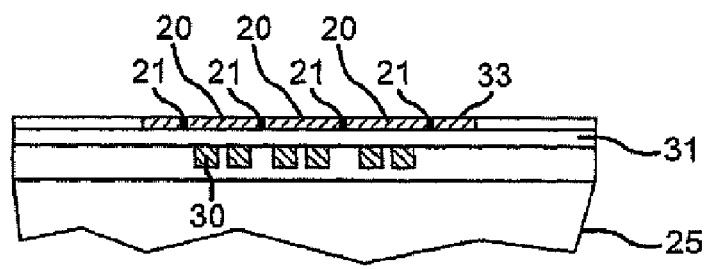

This magnetic deposit is then etched in order to define its geometry. The succession of discontinuities, air gaps 21 of a few microns wide in the example illustrated, is then made on the magnetic deposit to delimit the magnetic portions 20 (FIG. 13).

To do this, a localized deposit of the magnetic material is made by photolithography in the form of a pattern with air gap, or, if necessary partially, air gaps are etched on the continuous thin magnetic layer.

Then the magnetic deposit is covered with a new insulating layer 34 (FIG. 14), typically $SiO_2$ that is planarized leaving of the order of 1 micron of insulation on the magnetic material.

The layer of magnetic material is therefore located between an insulating layer 31 and an insulating layer 34 and is surrounded by insulation (in practice the one deposited when it was covered by the layer 34).

Figure 14:
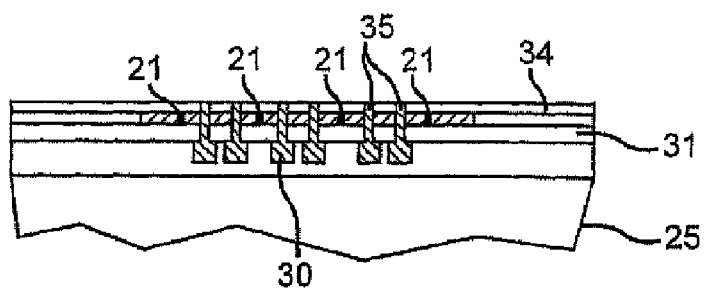

As illustrated in FIG. 14, the operations of making the connections 35 to the lower strands is carried out in order to begin to form the future turns. The production of these connections may be carried out by localized etching in order to hollow out trenches as far as the strands 30, then deposit and planarization of a conductive material in these trenches.

Figure 15:
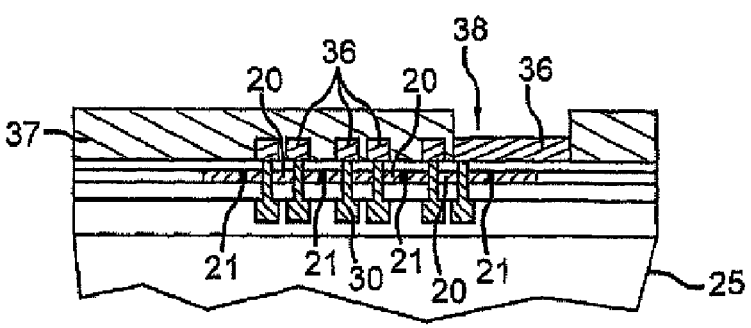

Finally, as illustrated in FIG. 15, a deposit 36 is made of a conductive material of a thickness equal to 1.5 microns. Then an etching is made so as to delimit top conductors in this conductive layer, thereby forming turns jointly with the strands 30 and the connections 35. Finally, a deposit of insulation 37 made of $SiO_2$ is made and then openings 38 are made to produce the electric contacts with the tracks 16 of the sensor.

Four other embodiments of the magnetic bars of a core according to the invention will now be described.

For each additional embodiment, the same reference numbers as for the preceding embodiment have been retained increased by the FIG. 100.

In an embodiment represented in FIGS. 7A and 7B, each magnetic bar 112 of the magnetic core 111 is made in a single piece and has permanent partial discontinuities at regular intervals, in this instance transverse grooves 121, extending over the whole width of the bar and locally reducing its thickness while delimiting the various magnetic portions 120. These grooves 121 are placed so that the magnetic portions 120 present only a single magnetic domain 106.

Therefore, during the transition to the demagnetized state, the grooves 121 form anchor lines on which, on each alternation of the flux, the magnetic walls 108 of the bar 112 are fixed naturally and reproducibly.

In the demagnetized state represented in FIG. 7B, the magnetic walls 106 are indistinguishable from the grooves 121 while the magnetic domains 106 coincide with the magnetic portions 120.

These grooves are made in a similar manner to the embodiment of the air gaps, either by photolithography or by laser abrasion for example. Another solution consists in depositing the magnetic material on pads previously made under the thin layer.

In another embodiment not shown, the grooves are replaced by any other type of permanent partial discontinuity such as, for example, inhomogeneities of structure making it possible to obtain a discontinuity between two adjacent magnetic domains either on the surface or in the volume of the bar in order to form the anchor zones of the magnetic walls without, for all that, dividing up the bar.

In this instance, permanent partial discontinuities are therefore understood notably to be both partial restrictions of section of the bar and inhomogeneities of structure of this bar.

To produce these inhomogeneities, one solution consists in locally modifying the structure of the material by carrying out a "localized annealing" for example with the aid of a laser or else in producing inclusions by depositing another material before, during or after the deposit of the magnetic material by photolithography or by ion implantation for example.

In yet another embodiment represented in FIGS. 8A and 8B, each magnetic bar 212 of the magnetic core 211 is made in a single piece and has on either side of the longitudinal direction of the bar notches 221 cut at regular intervals in the thickness of the bar locally reducing its width.

The magnetic walls 208 are therefore placed naturally between the points of two notches 221 situated opposite one another, the magnetic portions 220 having only a single magnetic domain 206.

These notches are made by being predefined in the masks making it possible to obtain the general shape of the thin magnetic layer.

It is also possible to apply these methods (stripes, inclusions, notches) to all sorts of patterns on the bar, according to the positions occupied by the magnetic domains such as those represented in FIG. 9B; the position and the general shape of the magnetic domains depend notably on the anisotropy of the magnetic material, its nature, its structure and its dimensions.

In another embodiment represented in FIGS. 10A and 10B, in the case in which the magnetic walls are oriented in the longitudinal direction of the bar (difficult axis) because, for example, of the anisotropy of shape or the anisotropy of the magnetic material, the bar 412 then has one or more stripes 421 extending over the whole width of the bar 412 locally reducing its width. One alternative consists in producing, instead of the stripe 421, one or more notches in the small sides of the bar in order to locally reduce the length of the latter so that the magnetic walls 408 are fixed naturally in the demagnetized state between the points of these notches.

In other embodiments not shown, the magnetic core has two disjointed magnetic bars forming together an open magnetic circuit.

The core may be made not of a single thin magnetic layer but of several thin magnetic layers separated by thin insulating layers (multilayers), the magnetic layers being magnetically coupled or not.

In yet other embodiments not shown, the sensor comprises an additional coil in order to apply a field compensating for the continuous or low frequency magnetic field to be measured and/or a stabilization coil deposited close to the microflux gate in order to participate in the reduction of the noise and the instabilities of the output signal.

In yet other embodiments, the coils may be solenoidal or a planar spiral and/or be interleaved.

In yet other embodiments, the discontinuities (the grooves for example) are made in an interrupted manner from one side to the other of the bars and/or these discontinuities are made not on a single face but on each of the main faces of the bars.

In other embodiments, the various types of discontinuities (total restrictions of section, partial restrictions of section, inhomogeneities of structure, etc.) may coexist within one and the same magnetic core or even within one and the same bar or segment of bar.

In yet other embodiments, the magnetic core is used to produce components other than miniature magnetic field sensors.

In the foregoing, and for all the embodiments exposed above, whether it be when the discontinuities are total or partial restrictions of section, in one direction or another of the bar, on one or two faces or else in the case of inhomogeneities of structure, the probable determination of the magnetic walls makes it possible to distribute the discontinuities optimally on the bar.

According to another aspect of the invention, innovative per se, the latter also relates in a very general manner to a miniature magnetic core having, in the demagnetized state, a plurality of magnetic domains separated by magnetic walls, characterized in that at least one bar segment has permanent partial discontinuities designed to fix the position of at least some of the magnetic walls (without necessarily determining them in advance).

The invention claimed is:

1. A miniature magnetic core comprising at least one magnetic bar having a plurality of magnetic domains each characterized by a magnetic moment, such that in a demagnetized state the magnetic moments of adjacent magnetic domains point in alternating directions, the magnetic domains are separated by non-stationary magnetic walls, wherein the at least one magnetic bar further includes permanent structural discontinuities located at least approximately in probable locations of at least some of the non-stationary magnetic walls, and wherein at least some of the structural discontinuities comprise inhomogeneities within the volume of the magnetic bar or total restrictions of a section of the magnetic bar.

2. The magnetic core according to claim 1, wherein the total restrictions comprise air gaps.

3. The magnetic core according to claim 1, wherein inhomogeneities comprise inclusions.

4. The magnetic core according to claim 3, wherein the magnetic bar comprises a magnetic material and the inclusions comprise a material different from the magnetic material.

5. The magnetic core according to claim 3, wherein the magnetic bar comprises a magnetic material and the inclusions comprise introduced ions of a different material from the magnetic material.

6. The magnetic core according to claim 1 further comprising a second bar similar to the at least one magnetic bar.

7. The magnetic core according to claim 6, wherein the at least one magnetic bar and the second bar are connected to one another at their ends by sections of magnetic material and thereby forming a closed magnetic circuit.

8. The magnetic core according to claim 1, wherein the magnetic core comprises a stack of successive layers.

9. The magnetic core according to claim 8, wherein at least some of the successive layers are magnetically coupled.

10. A miniature magnetic field sensor, comprising a miniature core comprising at least one magnetic bar having a plurality of magnetic domains each characterized by a magnetic moment, such that in a demagnetized state the magnetic moments of adjacent magnetic domains point in alternating directions, the magnetic domains are separated by non-stationary magnetic walls, wherein the at least one magnetic bar further includes permanent structural discontinuities located at least approximately in probable locations of at least some of the non-stationary magnetic walls, wherein the at least one magnetic bar interacts with at least one excitation coil and one detection coil.

11. The magnetic core according to claim 10, wherein at least some of the permanent structural discontinuities comprises total restrictions of a section of the magnetic bar.

12. The magnetic core according to claim 11, wherein the total restrictions comprise air gaps.

13. The magnetic core according to claim 10, wherein at least some of the structural discontinuities comprise partial restrictions of a section of the magnetic bar.

14. The magnetic core according to claim 13, wherein the partial restrictions comprise local restrictions along the thickness of the magnetic bar.

15. The magnetic core according to claim 14, wherein the local restrictions extend in a transverse direction of the magnetic bar.

16. The magnetic core according to claim 14, wherein the local restrictions extend in a longitudinal direction of the magnetic bar.

17. The magnetic core according to claim 13, wherein the partial restrictions comprise grooves in the magnetic bar.

18. The magnetic core according to claim 13, wherein in the partial restrictions comprise local restrictions along the width of the magnetic bar.

19. The magnetic core according to claim 18, wherein the local restrictions each comprise at least one notch on an edge of the magnetic bar.

20. The magnetic core according to claim 19, wherein the local restrictions each comprise two notches opposite one another and on either side of the magnetic bar.

21. The magnetic core according to claim 13, wherein the partial restrictions comprise local restrictions along the length of the magnetic bar.

22. The magnetic core according to claim 21, wherein the local restrictions each comprises at least one notch on an edge of the magnetic bar.

23. The magnetic core according to claim 10, wherein at least some of the structural discontinuities comprise inhomogeneities of the structure of the bar.

24. The magnetic core according to claim 23, wherein the inhomogeneities comprises features on the surface of the magnetic bar.

25. The magnetic core according to claim 23, wherein the inhomogeneities comprises features within the volume of the magnetic bar.

26. The magnetic core according to claim 23, wherein inhomogeneities comprise inclusions.

27. The magnetic core according to claim 10 further comprising a second bar similar to the at least one magnetic bar.

28. The magnetic core according to claim 27, wherein the at least one magnetic bar and the second bar are connected to one another at their ends by sections of magnetic material and thereby forming a closed magnetic circuit.

29. The magnetic core according to claim 10, wherein the magnetic core comprises a stack of successive layers.

30. The magnetic core according to claim 29, wherein at least some of the successive layers are magnetically coupled.

31. A micro-flux gate sensor comprising a miniature magnetic field sensor according to claim 10.

* * * * *